United States Patent
Chou et al.

(10) Patent No.: US 9,767,224 B2
(45) Date of Patent: Sep. 19, 2017

(54) SYSTEMS AND METHODS FOR DESIGNING AND FABRICATING CONTACT-FREE SUPPORT STRUCTURES FOR OVERHANG GEOMETRIES OF PARTS IN POWDER-BED METAL ADDITIVE MANUFACTURING

(71) Applicant: The Board of Trustees of The University of Alabama, Tuscaloosa, AL (US)

(72) Inventors: Yuag-Shan Chou, Tuscaloosa, AL (US); Kenneth Cooper, Huntsville, AL (US)

(73) Assignees: The Board of Trustees of The University of Alabama, Tuscaloosa, AL (US); The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 520 days.

(21) Appl. No.: 14/276,345

(22) Filed: May 13, 2014

(65) Prior Publication Data
US 2014/0335313 A1    Nov. 13, 2014

Related U.S. Application Data

(60) Provisional application No. 61/822,595, filed on May 13, 2013.

(51) Int. Cl.
*B22F 3/105* (2006.01)
*G06F 17/50* (2006.01)
*B33Y 10/00* (2015.01)

(52) U.S. Cl.
CPC ............ *G06F 17/50* (2013.01); *B22F 3/1055* (2013.01); *B33Y 10/00* (2014.12);
(Continued)

(58) Field of Classification Search
CPC  B22F 3/105; B22F 3/1055; B22F 2003/1058; G06F 17/50; Y10T 428/24479; Y02P 10/295
See application file for complete search history.

(56) References Cited

U.S. PATENT DOCUMENTS

| 4,999,143 A * | 3/1991 | Hull ................. B29C 41/12 156/273.3 |
| 5,669,433 A * | 9/1997 | Sterett ............... B22D 23/00 164/46 |

(Continued)

OTHER PUBLICATIONS

Co-pending U.S. Appl. No. 14/940,564, filed Nov. 13, 2015.
"Software for additive manufacturing: Magics", published Jan. 29, 2013, accessed Mar. 20, 2016 via www.waybackmachine.org.

*Primary Examiner* — Patricia L Nordmeyer
(74) *Attorney, Agent, or Firm* — Meunier Carlin & Curfman LLC

(57) ABSTRACT

Systems and methods are provided for designing and fabricating contact-free support structures for overhang geometries of parts fabricated using electron beam additive manufacturing. One or more layers of un-melted metallic powder are disposed in an elongate gap between an upper horizontal surface of the support structure and a lower surface of the overhang geometry. The powder conducts heat from the overhang geometry to the support structure. The support structure acts as a heat sink to enhance heat transfer and reduce the temperature and severe thermal gradients due to poor thermal conductivity of metallic powders underneath the overhang. Because the support structure is not connected to the part, the support structure can be removed freely without any post-processing step.

9 Claims, 8 Drawing Sheets

(52) U.S. Cl.
CPC ..... *B22F 2003/1058* (2013.01); *Y02P 10/295* (2015.11); *Y10T 428/24479* (2015.01)

(56) References Cited

U.S. PATENT DOCUMENTS

| | | | | |
|---|---|---|---|---|
| 5,746,844 | A | * | 5/1998 | Sterett ............... B22F 3/115 148/522 |
| 5,787,965 | A | * | 8/1998 | Sterett ............... B22D 23/00 164/155.3 |
| 6,410,105 | B1 | * | 6/2002 | Mazumder ........ B23K 26/032 219/121.65 |

* cited by examiner

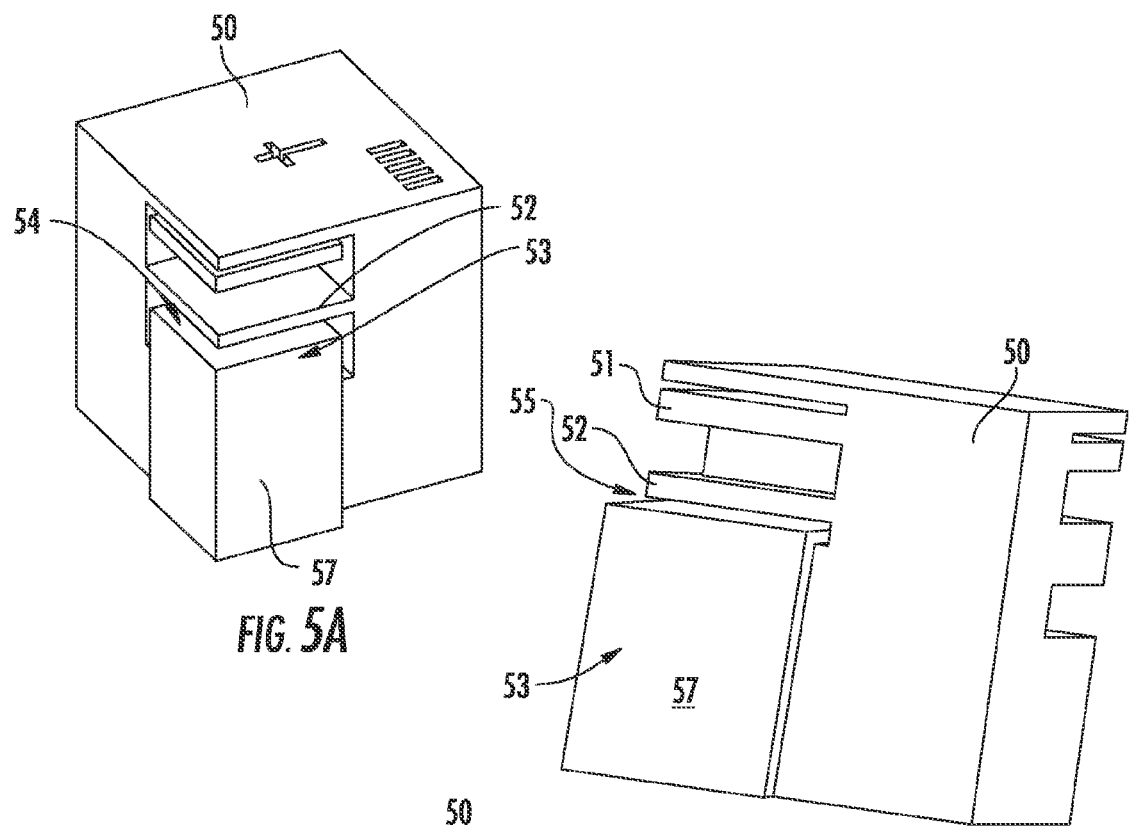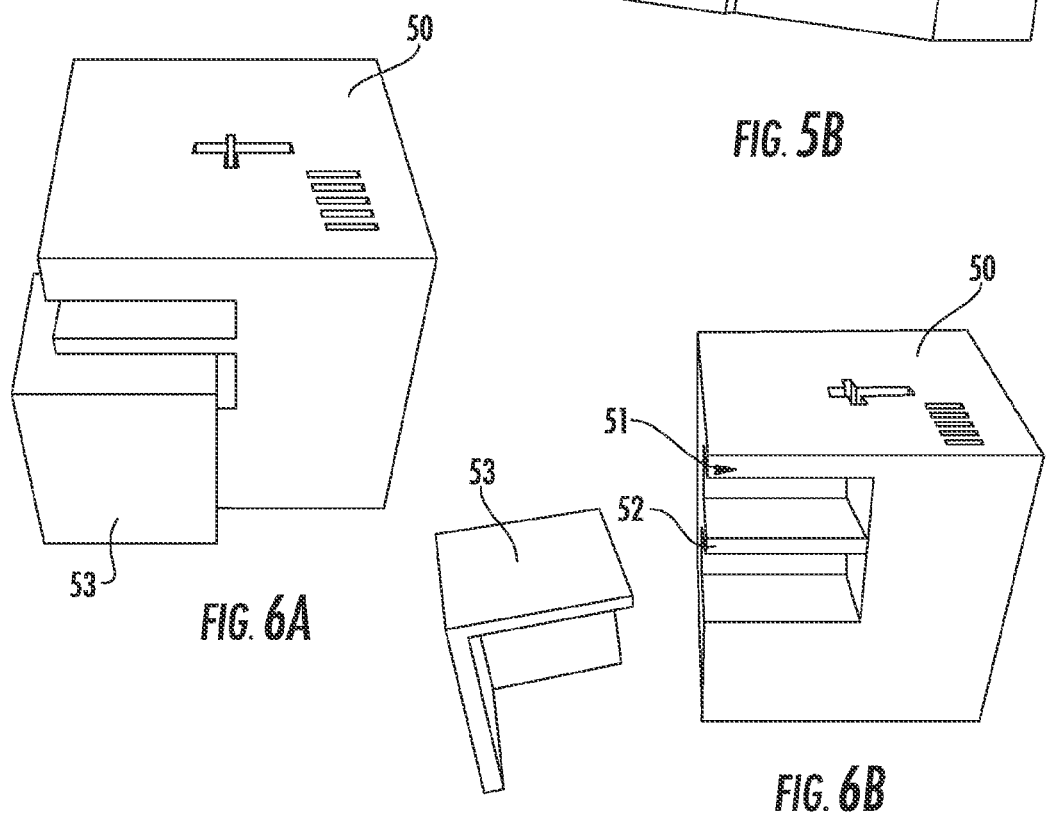

SYSTEMS AND METHODS FOR DESIGNING AND FABRICATING CONTACT-FREE SUPPORT STRUCTURES FOR OVERHANG GEOMETRIES OF PARTS IN POWDER-BED METAL ADDITIVE MANUFACTURING

CROSS REFERENCE TO RELATED APPLICATIONS

This application claims priority to U.S. Provisional Patent Application No. 61/822,595, filed May 13, 2013, and entitled "Systems and Methods for Designing and Fabricating Contact-Free Support Structures for Overhang Geometries of Parts in Powder-Bed Metal Additive Manufacturing," the content of which is herein incorporated by reference in its entirety.

STATEMENT REGARDING FEDERALLY SPONSORED RESEARCH

This invention was made with government support under Grant No. NNX11AM11A awarded by NASA. The government has certain rights in the invention.

BACKGROUND

Implementations of the present invention relate to methods of designing and fabricating support structures for overhang geometries of parts produced using electron beam additive manufacturing.

Powder-based electron beam additive manufacturing (EBAM) is an additive manufacturing (AM) technology by which physical solid parts are made, layer-by-layer, directly from electronic data. The electronic data is generally provided in files from computer-aided design (CAD) software. EBAM utilizes a high-energy electron beam, as a moving heat source, to melt and fuse metallic powders and produce parts in a layer-wise fashion.

If a part has overhang geometry, such as a cantilevered overhang or undercut portion, defects such as curling may occur due to the thermal gradient cycles that lead to high thermal stresses and geometric deformation. FIG. 1A illustrates a CAD model of a part 10 having two overhang portions 11, 12, and FIG. 1B illustrates the part 10 fabricated using EBAM without a support structure and curling at the end of the overhang portions 11, 12.

A current practice for countering this curling effect is to build a support structure with the part that connects the overhang portion with the support structure. In particular, the geometry of the support structure is incorporated in the part model (CAD format) and becomes solid from metallic powders during the EBAM process, connecting the support structure to the overhang portion. FIG. 2A illustrates an example of a typical lattice support design 20a, 20b for upper and lower overhang portions, respectively. Although the support structure 20a, 20b may eliminate the part deformation problem, the support structure 20a, 20b is bonded to the part and needs to be removed in post-processing using a mechanical tool, typically. This process is laborious, time consuming, and degrades the surface quality of the cantilevered portion. FIG. 2B shows support structure 20b mostly removed from the example part.

Accordingly, improved methods and articles of manufacture are needed to reduce labor and time required for fabrication and to improve the quality of the part.

BRIEF SUMMARY

According to various implementations, systems and methods are provided for designing and fabricating contact-free support structures for overhang geometries of parts fabricated using additive manufacturing, such as electron beam additive manufacturing. In particular, one or more layers of un-melted metallic powder are disposed in a substantially continuous, elongate horizontal gap between an upper horizontal surface of the support structure and a lower surface of the overhang geometry. This powder conducts heat from the overhang geometry to the support structure. The support structure acts as a heat sink to enhance heat transfer and reduce the temperature and severe thermal gradients due to poor thermal conductivity of metallic powders underneath the overhang. Because the support structure is not connected to the part, the support structure can be removed freely without any post-processing step.

A method of designing a support structure according to one implementation includes: (1) receiving dimensions of a part comprising at least one overhang portion and a lower surface of the overhang portion; (2) receiving dimensions of a support structure comprising a substantially horizontal support portion and an upper surface of the substantially horizontal support portion; (3) calculating temperature distributions expected on the part during fabrication thereof using additive manufacturing; and (4) calculating a thickness range of un-melted metallic powder to be disposed within an elongate gap being defined between the lower surface of the overhang portion and the upper surface of the substantially horizontal support portion of the support structure. Calculating the thickness range includes balancing conduction of heat from the overhang portion to the substantially horizontal support portion against potential fusion of the un-melted metallic powder. The un-melted metallic powder may be disposed in a layer-by-layer fashion. The support structure may also include at least one substantially vertical support portion extending between the substantially horizontal support portion and a build plate. The substantially vertical support portion is configured for conducting heat from the substantially horizontal support portion to the build plate. Calculating the thickness range may include using at least the dimensions of the part, the calculated expected temperature distributions on the part, and heat transfer analysis. Calculating the thickness range may also include using finite element simulation for transient heat transfer analyses. In addition, electron beam additive manufacturing may be used for fabricating the support structure according to the calculated dimensions. Furthermore, the overhang portion may include a cantilevered overhang or an undercut portion.

An article of manufacture according to one implementation includes: (1) a part comprising at least one substantially horizontal overhang portion and a lower surface of the overhang portion; and (2) a support structure comprising at least one substantially horizontal support portion and an upper surface of the substantially horizontal support portion. The part and the support structure are continuously spaced apart from each other and are fabricated during one process. The upper surface of the substantially horizontal support portion of the support structure and a lower surface of the overhang portion of the part define an elongate gap therebetween, and un-melted metallic powder is disposed within the gap. The un-melted metallic powder in the gap is configured for conducting heat from the overhang portion of the part to the support structure without fusing. The un-melted metallic powder may be disposed in a layer-by-layer fashion. In addition, the fabrication process may include electron beam additive manufacturing.

A method of fabricating a part comprising at least one overhang portion according to one implementation includes:

(1) fabricating, using additive manufacturing, a support structure comprising at least one substantially horizontal support portion; (2) depositing metallic powder onto at least a portion of the substantially horizontal support portion; (3) melting an upper layer of the metallic powder using a heat source to form at least a portion of a lower surface of an overhang portion of a part; (4) depositing and melting one or more additional layers of metallic powder on the upper layer until a desired thickness of the overhang portion is achieved; and (5) freely removing the support structure from a footprint of the part after the desired thickness of the overhang portion is achieved. In one implementation in which additive manufacturing comprises electron beam additive manufacturing, the heat source is an electron beam.

BRIEF DESCRIPTION OF THE DRAWINGS

FIG. 5A illustrates a perspective view of a CAD model of a part and support structure according to one implementation.

FIG. 5B illustrates a perspective view of the CAD model in FIG. 5A from another perspective.

FIG. 6A illustrates the part shown in FIGS. 5A and 5B fabricated using EBAM.

FIG. 6B illustrates the part shown in FIG. 6A with the support structure freely removed from the part.

DETAILED DESCRIPTION

According to various implementations, systems and methods are provided for designing and fabricating contact-free support structures for overhang geometries of parts fabricated using additive manufacturing, such as electron beam additive manufacturing. In particular, one or more layers of un-melted metallic powder are disposed in a substantially continuous, elongate horizontal gap between an upper horizontal surface of the support structure and a lower surface of the overhang geometry. This powder conducts heat from the overhang geometry to the support structure. The support structure acts as a heat sink to enhance heat transfer and reduce the temperature and severe thermal gradients due to poor thermal conductivity of metallic powders underneath the overhang. Because the support structure is not connected to the part, the support structure can be removed freely without any post-processing step.

In powder-based electron beam additive manufacturing (EBAM), physical solid parts are made, layer-by-layer, directly from electronic data, such as files from computer-aided design (CAD) software. EBAM utilizes a high-energy electron beam as a moving heat source to melt and fuse metallic powders and produce parts in a layer-wise fashion. Exemplary advantages of using additive manufacturing include short lead time, design freedom in geometry, and lack of tooling. In addition, EBAM allows for fabricating full-density metallic parts.

Figure 1A:
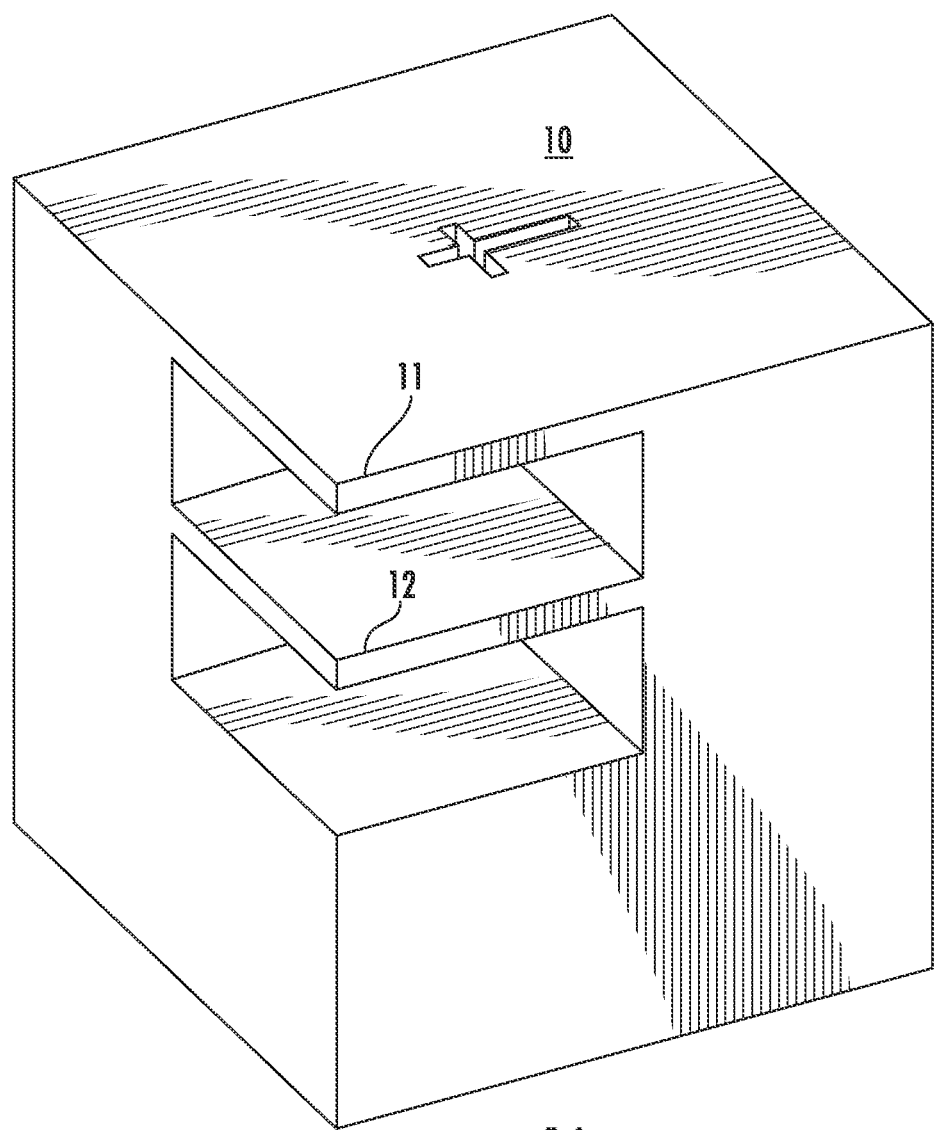
FIG. 1A illustrates a CAD model of a part having two overhang portions according to one implementation.
Figure 1B:
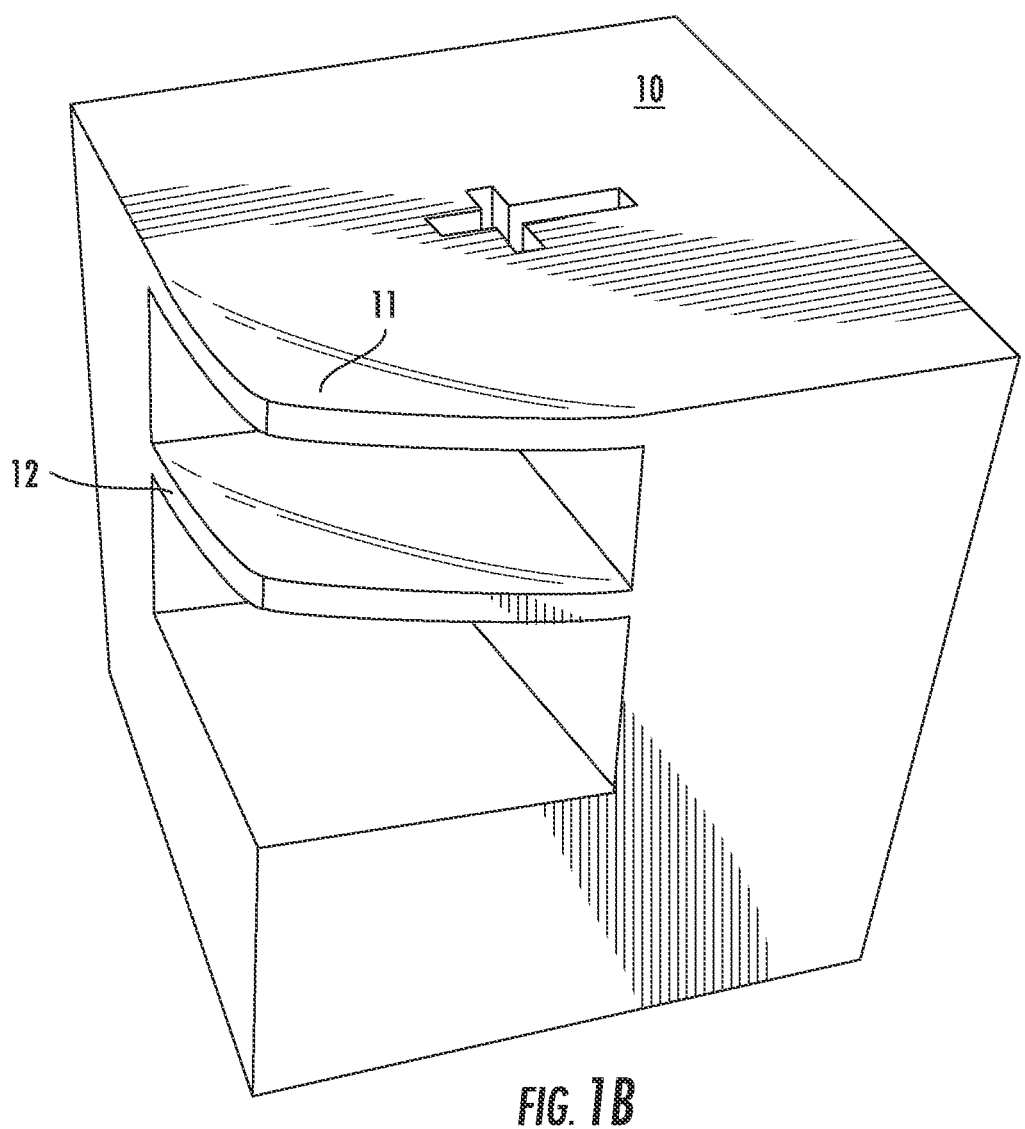
FIG. 1B illustrates the part shown in FIG. 1A fabricated using EBAM without a support structure.
Figure 2A:
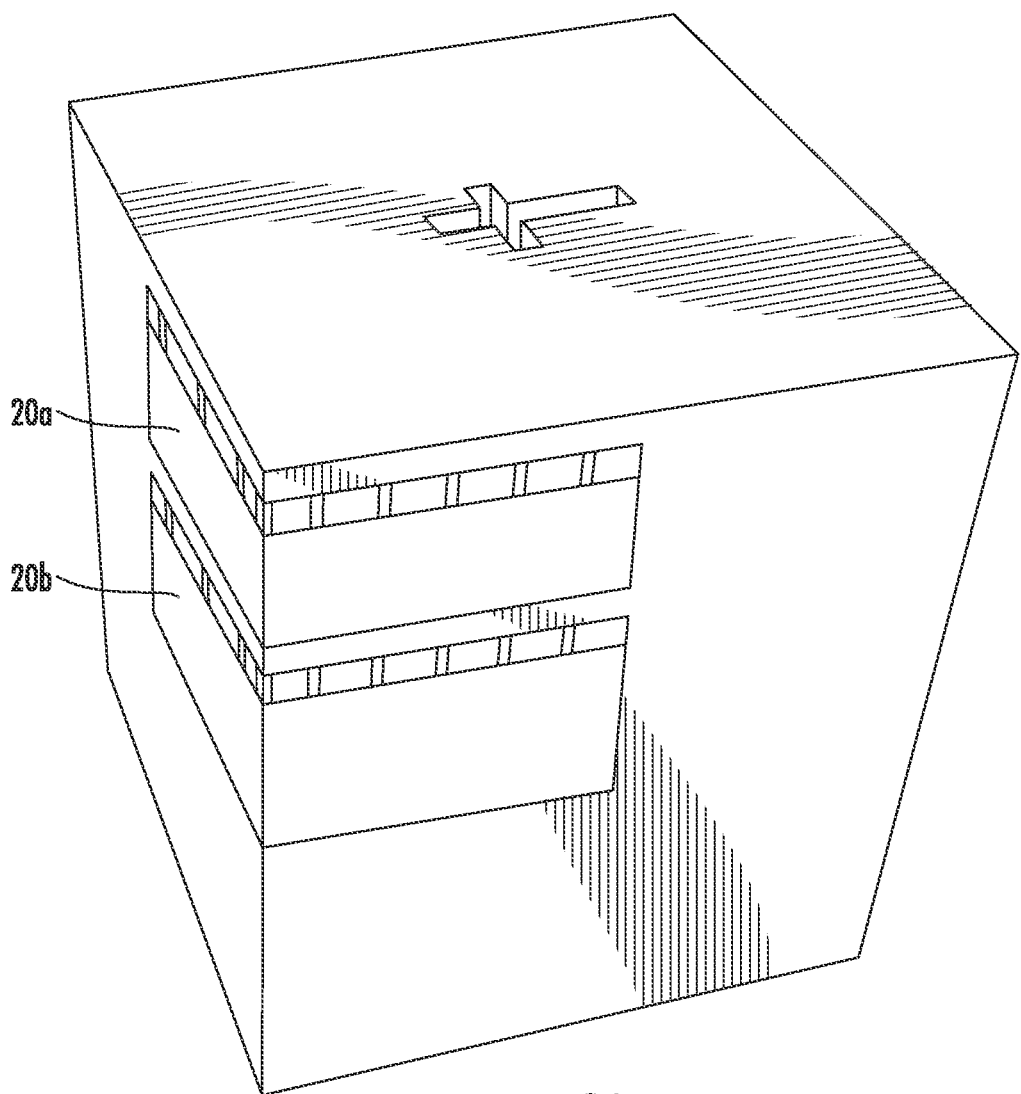
FIG. 2A illustrates an exemplary, prior art support structure for the part shown in FIG. 1A fabricated using EBAM.
Figure 2B:
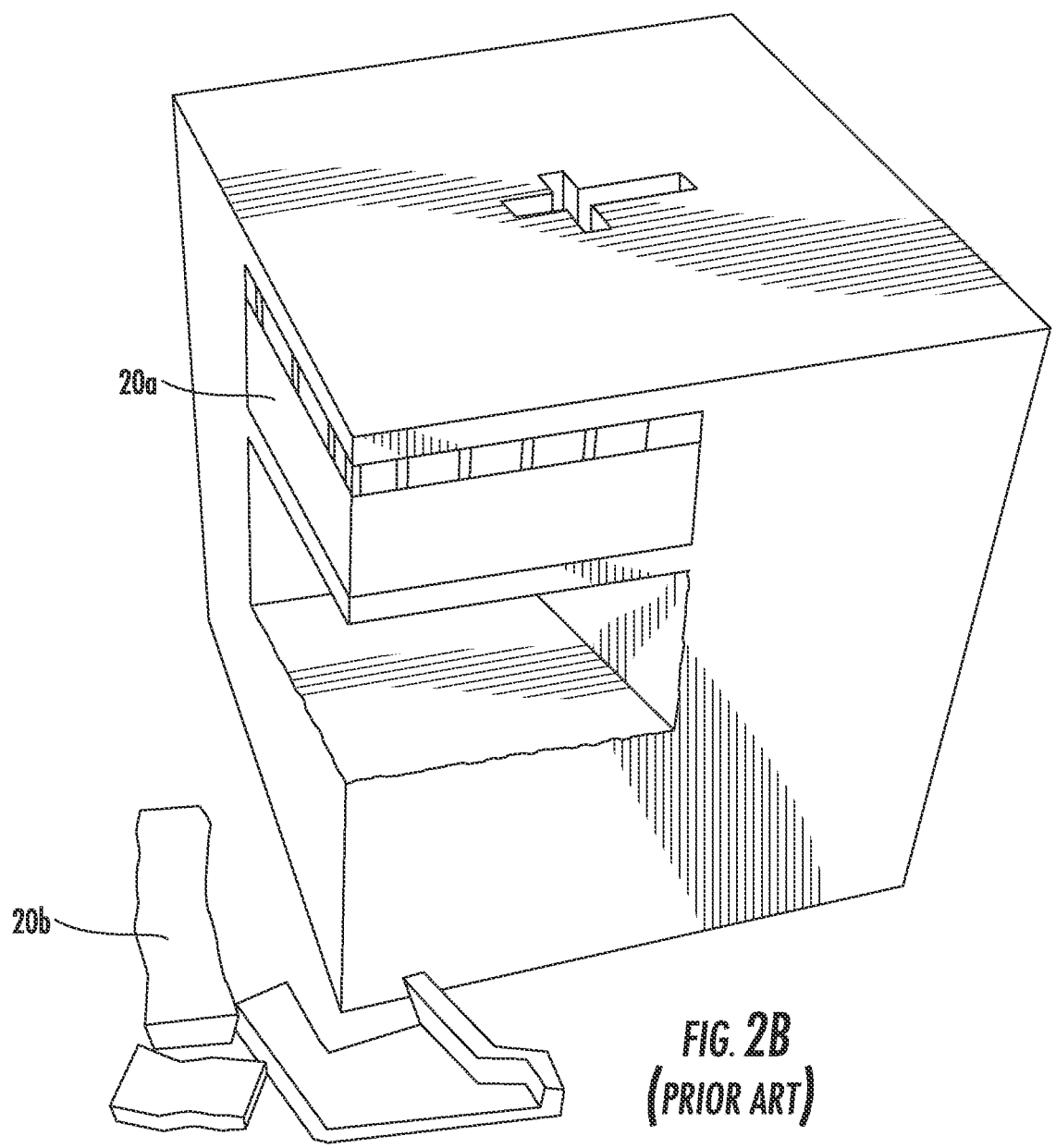
FIG. 2B illustrates the support structure in FIG. 2A partially removed.
Figure 3A:
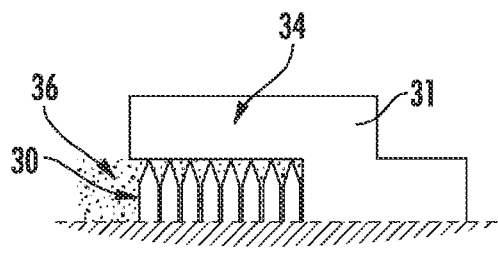
FIG. 3A illustrates a side view schematic of a prior art support structure.

As discussed above in relation to FIGS. 1A and 1B, the root mechanism of overhang defects is severe thermal gradients due to poor thermal conductivity of metallic powders used in the process. Conventional support designs, such as the design shown in FIGS. 2A and 3A, may include a lattice support structure that is bonded to the part and needs to be physically cut or broken from the part after fabrication with a mechanical tool. This post-processing step may be time consuming and cumbersome. FIG. 3A illustrates another exemplary support structure 30 that is bonded to an overhang portion 34 of a part 31.

Figure 3B:
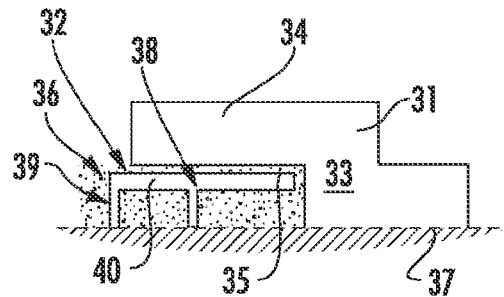
FIG. 3B illustrates a side view schematic of a contact-free support structure according to one implementation.

FIG. 3B illustrates an example of an improved, contact-free support structure 35 according to one implementation. The support structure 35 is fabricated with the part 31, or work piece, using EBAM or other suitable additive manufacturing process. The part 31 includes a substantially vertical portion 33 and at least one substantially horizontal overhang portion 34 extending from the substantially vertical portion 33. The support structure 35 includes a substantially horizontal support portion 40, an internal vertical support portion 38, and an external vertical support portion 39. The vertical support portions 38, 39 extend between the horizontal support portion 40 and a build plate 37. An upper surface of the horizontal support portion 40 of the support structure and a lower surface of the overhang portion 34 of the part 31 define an elongated gap 32 therebetween, and un-melted metallic powder 36 is disposed within the gap 32. The thickness, or height, range of the gap 32 is sized such that the un-melted metallic powder 36 in the gap 32 is configured for conducting heat from the overhang portion 34 of the part 31 to the support structure 35 without fusing the part 31 to the support structure 35. In other words, the gap 32 is configured for providing a necessary rate of heat dissipation without reaching a fusion threshold for the powder. According to various implementations, the length to height ratio for the elongate gap 32 may differ depending on the structure to be manufactured. For example, in certain implementations, the length to height ratio for the gap may be between about 1 and about 10. However, in other implementations, the ratio may be greater than about 10. For example, in one exemplary structure, the gap has a length of about 11.7 mm and a height of about 0.64 mm, resulting in a ratio of about 18.

The support structure 35 acts as a heat sink to enhance heat transfer, lower part temperatures, thermal gradient, and thus, eliminate part deformations. The gap 32, which is filled with un-melted metallic powders 36 as occurs during the process, is designed to be suitable to the process and part 31. If the gap 32 is too small, the gap 32 will be fused with the overhang portion 34. If the gap 32 is too large, the heat dissipation will not be efficient for temperature reductions. A comprehensive heat transfer analysis is used to determine the feasible range of the gap 32 necessary for efficient heat conduction. In addition, vertical pieces 38, 39 extend to the build plate 37 and serve as the heat flow channel. Hence, the contact-free support structure 35 is designed for the "heat-load" purpose. Because the support structure 35 is not for supporting the weight of the part 31, direct contact between the support structure 35 and the part 31 is possible but not necessary.

FIGS. 5A and 5B illustrate a CAD model of another part 50 from different perspectives, according to one implementation. The part 50 has two overhang portions 51, 52 and a contact-free support structure 53. The support structure 53 includes a horizontal support portion 54 disposed underneath the lower overhang 52 with a gap 55 of about 0.6 mm (with about 12% tolerance) defined between the horizontal support portion 54 and the lower overhang 52. The support structure 53 also includes a vertical plate 57 that extends to the build plate.

FIGS. 6A and 6B illustrate the part 50 and the support structure 53 shown in FIGS. 5A and 5B fabricated using EBAM. The part 50 and the support structure 53 are continuously spaced apart from each other (i.e., they have no rigid connections) and are fabricated substantially simultaneously with each other. FIG. 6A illustrates the part 50 with the contact-free support structure 53 partially removed. FIG. 6B illustrates the part 50 and the support structure 53 completely removed, showing no warping defect on the part's 50 overhang portions 51, 52.

Figure 7:
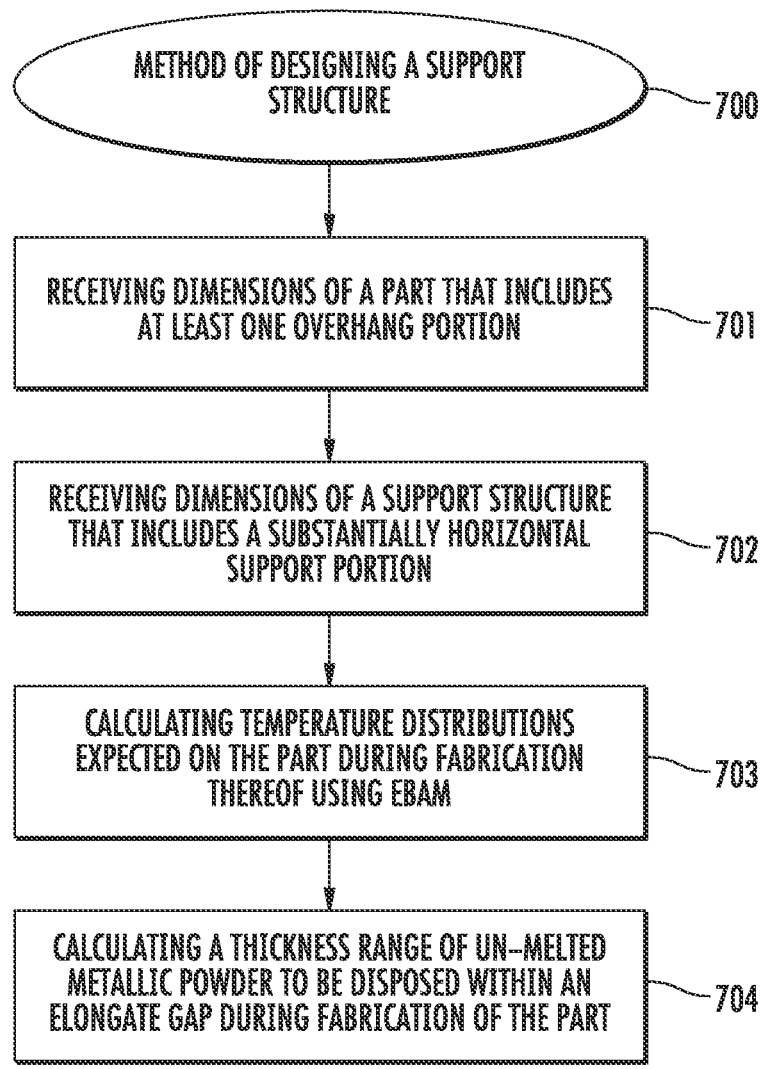
FIG. 7 illustrates a method of designing a support structure according to one implementation.

FIG. 7 illustrates a method of designing a support structure according to one implementation. In particular, the method begins at step 701 with receiving dimensions of a part that includes at least one overhang portion. In step 702, the dimensions of a support structure that includes a substantially horizontal support portion are received. In step 703, the temperature distributions expected on the part during fabrication thereof using electron beam additive manufacturing are calculated. Then, in step 704, a thickness range of un-melted metallic powder to be disposed within an elongate gap during fabrication of the part is calculated. Calculating the thickness range includes balancing conduction of heat from the overhang portion to the substantially horizontal support portion against potential fusion of the un-melted metallic powder.

For example, in designing a support structure for a simple overhang configuration, such as shown in FIG. 3B, a finite element simulation is conducted using a commercial software package for transient heat transfer analyses of a simple overhang configuration such as is shown in FIG. 3B, according to one implementation. The simulation assumes that the electron beam is moving at a constant speed, without and with the invented support. The software package may be ABAQUS, for example.

Figure 4:
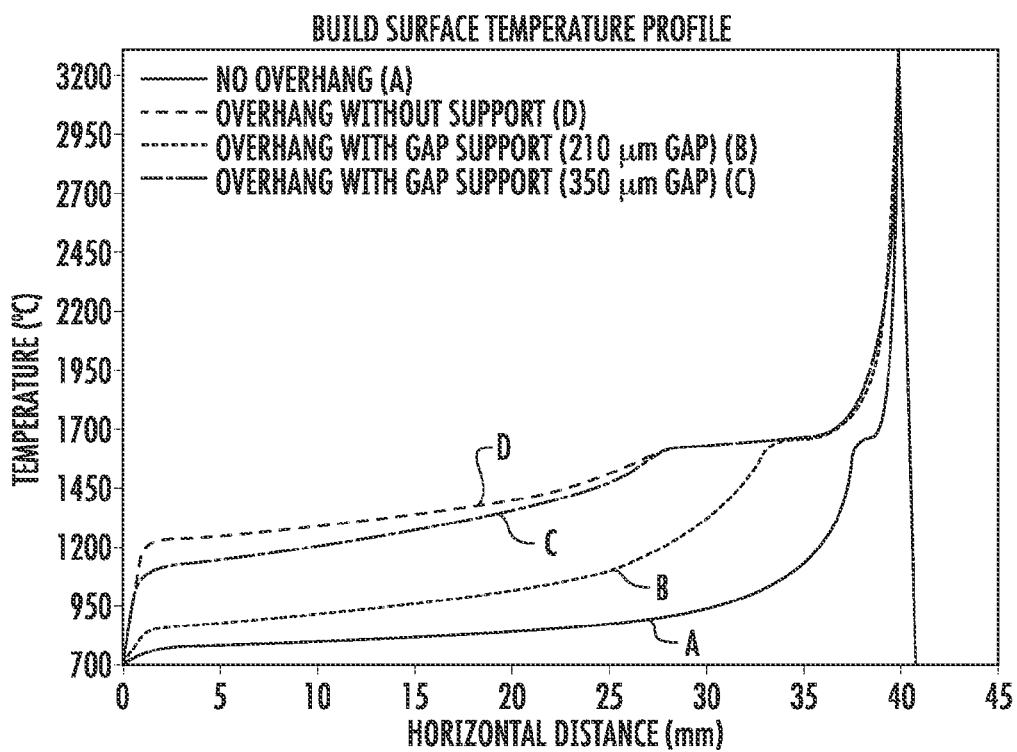
FIG. 4 illustrates a graph that compares build part surface temperature profiles when fabricating the first overhang layer with the following scenarios: no overhang, or overhang without and with the designed support of different gap sizes.

FIG. 4 illustrates the simulated build part surface temperature profiles when fabricating the first overhang layer under different scenarios: no overhang (line A), or an overhang without a support structure (line D), and an overhang with the above-described contact-free support structure and different gap sizes (lines B and C). In particular, a gap of 210 μm (see line B) yields lower temperatures across the length of the build part surface than a 350 μm gap (see line C) or having no support at all (see line D). The results demonstrate the effectiveness of substantial temperature reductions, which consequently alleviates thermal stresses, by adding the contact-free support structure. The results also illustrate the importance of the gap size The simulation assumes that electron beam additive manufacturing is used to fabricate the part and support structure using a Ti-6Al-4V alloy powder. The x-axis refers to the distance from the beginning of the electron beam scanning. The temperature profiles in the plot imply that the electron beam scans from left to right. The low temperature on the far right is the initial temperature before the electron beam reaches the area. The peak temperature (over 3000° C.) can approximate as the instantaneous electron beam location at that moment. The sharp temperature rise, which is around 40 mm from the scanning beginning location in this simulation, is due to the high-energy intensity of the electron beam and the high moving speed. Once the beam passes, the temperature drops fairly quickly due to the rapid self-cooling by the material beneath the surface. The plateau region corresponds to the melting/solidification temperature range (about 1665° C. for the simulated material). Once the solidification phase is completed, the temperature continues to decay and eventually back to the initial temperature of about 700° C. The temperature curves are obtained by a numerical method, such as finite element analysis.

Figure 8:
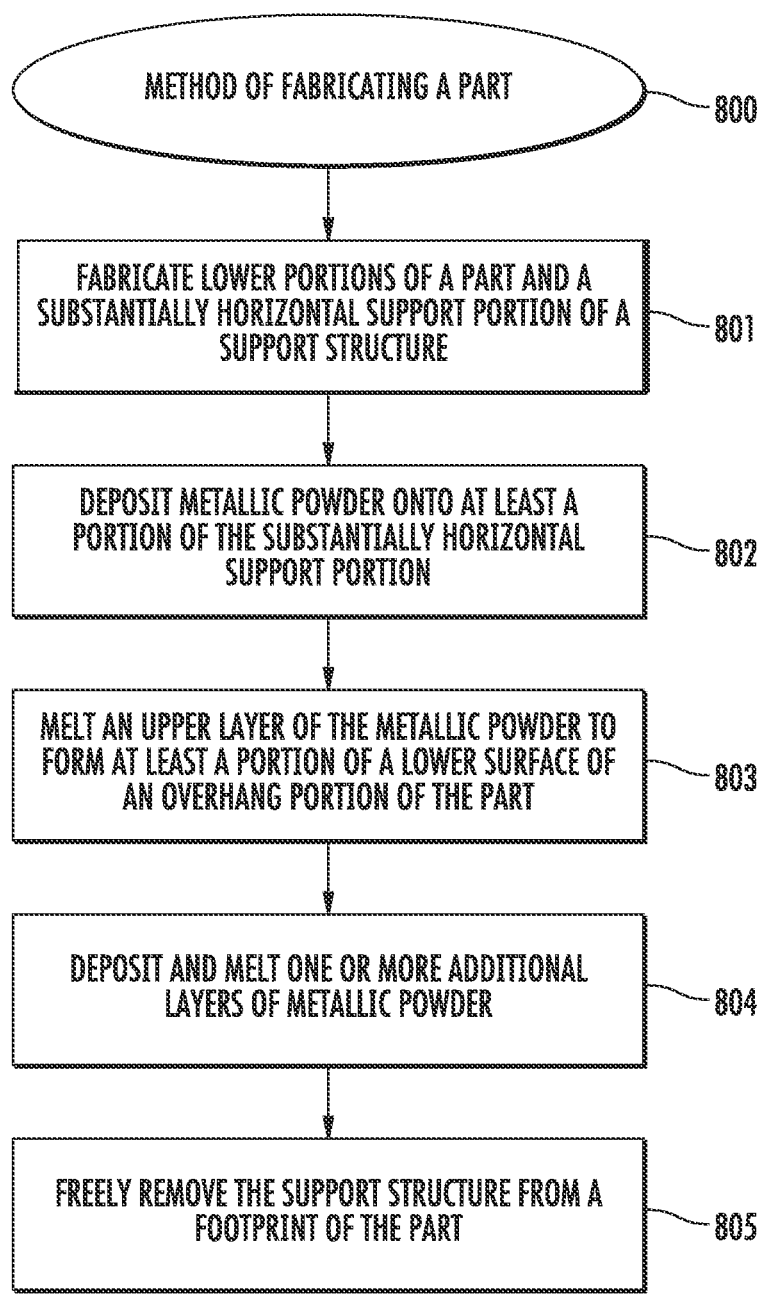
FIG. 8 illustrates a method of fabricating a part having at least one overhang portion according to one implementation.

FIG. 8 illustrates a method of fabricating a part that includes at least one overhang portion according to one implementation. In step 801, lower portions of the part and a substantially horizontal support portion of the support structure are fabricated using additive manufacturing. Depending on the configuration of the part, one or more additional vertical support portions may be fabricated to extend between the horizontal support portion and the build plate. In step 802, metallic powder is deposited onto at least a portion of the substantially horizontal support portion. In step 803, an upper layer of the metallic powder is melted using a heat source to form at least a portion of a lower surface of an overhang portion of the part. In step 804, one or more additional layers of metallic powder are deposited and melted on the upper layer until a desired thickness of the overhang portion is achieved. Then, in step 805, the support structure is freely removed from a footprint of the part.

An exemplary advantage of the contact-free support structure is that it eliminates overhang-associated defects and there is no post-processing removal step. In addition, this structure provides process performance enhancement, simplifies designs, and improves part quality.

The described methods, systems, and apparatus should not be construed as limiting in any way. Instead, the present disclosure is directed toward all novel and nonobvious features and aspects of the various disclosed implementations, alone and in various combinations and sub-combinations with one another. The disclosed methods, systems, and apparatus are not limited to any specific aspect, feature, or combination thereof, nor do the disclosed methods, systems, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, systems, and apparatus can be used in conjunction with other systems, methods, and apparatus.

The invention claimed is:

1. An article of manufacture comprising:
   a primary part comprising at least one substantially horizontal overhang portion, the overhang portion having a lower surface; and
   a secondary part comprising at least one substantially horizontal support portion, the substantially horizontal support portion having an upper surface,
   wherein the lower surface of the primary part and the upper surface of the secondary part are continuously spaced apart from each other and are fabricated during one process using the same metallic powder, and wherein the upper surface of the substantially horizontal support portion of the secondary part and the lower surface of the overhang portion of the primary part define an elongate gap therebetween, and un-melted metallic powder is disposed within the gap.

2. The article of claim 1, wherein the secondary part further comprises at least one substantially vertical support portion extending between the substantially horizontal support portion and a build plate, the substantially vertical support portion configured for conducting heat from the substantially horizontal support portion to the build plate.

3. The article of claim 1, wherein the elongate gap is substantially continuous.

4. The article of claim 3, wherein the elongate gap is substantially horizontal.

5. The article of claim 1, wherein the un-melted metallic powder in the gap is configured for conducting heat from the overhang portion of the primary part to the secondary part without fusing.

6. The article of claim 1, wherein the one process comprises electron beam additive manufacturing.

7. The article of claim 1, wherein the un-melted metallic powder is disposed in a layer-by-layer fashion.

8. The article of claim 1, wherein the overhang portion is a cantilever.

9. The article of claim 1, wherein the overhang portion is an undercut portion.

* * * * *